(12) United States Patent
Pfahnl et al.

(10) Patent No.: US 6,717,115 B1
(45) Date of Patent: Apr. 6, 2004

(54) SEMICONDUCTOR HANDLER FOR RAPID TESTING

(75) Inventors: Andreas C. Pfahnl, Goffstown, NH (US); John D. Moore, Deerfield, NH (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/585,453

(22) Filed: Jun. 1, 2000

Related U.S. Application Data

(60) Provisional application No. 60/199,487, filed on Apr. 25, 2000.

(51) Int. Cl.[7] .............................. H05B 3/68; C23C 16/00
(52) U.S. Cl. ..................................... 219/444.1; 118/724
(58) Field of Search ........................... 219/444.1, 544; 118/724, 725, 728, 729; 165/80.2, 80.3, 80.4, 80.5

(56) References Cited

U.S. PATENT DOCUMENTS

| | | | |
|---|---|---|---|
| 4,208,159 A | * 6/1980 | Uehara et al. ............... 118/50 |
| 4,370,011 A | 1/1983 | Suzuki et al. ................ 339/74 |
| 4,573,067 A | * 2/1986 | Tuckerman et al. ......... 257/713 |
| 4,604,572 A | 8/1986 | Horiuchi et al. ............. 324/158 |
| 4,721,462 A | * 1/1988 | Collins, Jr. ................... 432/253 |
| 4,787,752 A | 11/1988 | Fraser et al. .................. 374/45 |
| 4,791,364 A | 12/1988 | Kufis et al. .................. 324/158 |
| 4,848,090 A | 7/1989 | Peters ............................ 62/3.3 |
| 4,962,355 A | 10/1990 | Holderfield et al. ........ 324/158 |
| 4,982,153 A | 1/1991 | Collins et al. ............... 324/158 |
| 5,001,423 A | * 3/1991 | Arami et al. ............. 219/444.1 |
| 5,086,269 A | 2/1992 | Nobi ........................... 324/158 |
| 5,126,656 A | 6/1992 | Jones .......................... 324/158 |
| 5,164,661 A | 11/1992 | Jones .......................... 324/158 |
| 5,166,607 A | 11/1992 | Long ........................... 324/158 |
| 5,294,778 A | * 3/1994 | Carman et al. .......... 219/444.1 |
| 5,309,978 A | 5/1994 | Noble, Jr. et al. .............. 165/1 |
| 5,315,240 A | 5/1994 | Jones .......................... 324/158 |
| 5,343,012 A | * 8/1994 | Hardy et al. ............. 219/444.1 |
| 5,360,348 A | 11/1994 | Johnson ........................ 439/72 |
| 5,420,521 A | 5/1995 | Jones .......................... 324/760 |
| 5,523,678 A | 6/1996 | Mitsui ....................... 324/158.1 |

(List continued on next page.)

FOREIGN PATENT DOCUMENTS

| EP | 0462563 | 12/1991 | ........... H01L/21/00 |
|---|---|---|---|
| WO | 97/15837 | 5/1997 | ......... G01R/31/316 |

OTHER PUBLICATIONS

Handbook of Heat Transfer, Rohsenow wt al. (ed.); 1998 Pp 5.1–5.137; 11.1–11.76.
Patent Abstracts of Japan; vol. 018, No. 277 (E–1554), May 26, 1994—& JP 06 053027A (Tokyo Electron Ltd), Feb. 25, 1994 abstract.
Patent Abstracts of Japan; vol. 2000, No. 02, Feb. 29, 2000—& JP 11 329926 A (Dainippon Screen Mfg Co Ltd), Nov. 30, 1999 abstract.
Patent Abstracts of Japan; vol. 017, No. 525 (E–1436), Sep. 21, 1993—& JP 05 144777 A (Sony Corp), Jun. 11, 1993 abstract.

*Primary Examiner*—Sang Paik
(74) *Attorney, Agent, or Firm*—Lance Kreisman; Edmund J. Walsh; Teradyne Legal Dept.

(57) ABSTRACT

A strip, leadframe or panel type handling device for use in testing semiconductor components. The handling device has a thermal plate assembly with embedded electrical resistance heaters. The heaters are separately controlled in zones to provide uniform temperature across the plate for elevated temperature testing. Cooling channels are formed in the plate. Intermingling channels are provided to allow different types of cooling fluids to be used to cool at different rates or hold a cold temperature at different levels. The cooling channels can likewise be provided in zones to promote temperature uniformity. Vacuum channels are used to hold the semiconductor parts under test in close contact with the thermal plate.

26 Claims, 15 Drawing Sheets

U.S. PATENT DOCUMENTS

| | | | |
|---|---|---|---|
| 5,528,159 A | 6/1996 | Charlton et al. | 324/758 |
| 5,807,066 A | 9/1998 | Smith | 414/802 |
| 5,821,505 A | 10/1998 | Tustaniwskyj et al. | 219/494 |
| 5,844,208 A | 12/1998 | Tustaniwskyj et al. | 219/494 |
| 5,846,375 A | 12/1998 | Gilchrist et al. | 156/345 |
| 5,847,293 A | 12/1998 | Jones | 73/865.8 |
| 5,847,366 A | 12/1998 | Grunfeld | 219/497 |
| 5,851,298 A * | 12/1998 | Ishii | 118/728 |
| 5,854,468 A * | 12/1998 | Muka | 219/444.1 |
| 5,927,077 A | 7/1999 | Hisai et al. | 62/3.3 |
| 5,966,940 A | 10/1999 | Gower et al. | 62/3.3 |
| 5,993,591 A | 11/1999 | Buendia et al. | 156/275.5 |
| 6,024,526 A | 2/2000 | Slocum et al. | 414/226.01 |
| 6,084,215 A * | 7/2000 | Furuya et al. | 219/444.1 |
| 6,166,937 A * | 12/2000 | Yamamura et al. | 363/141 |

\* cited by examiner

SEMICONDUCTOR HANDLER FOR RAPID TESTING

RELATED APPLICATION

This application claims priority to a provisional application, serial No. 60/199,487, filed Apr. 25, 2000, entitled "Semiconductor Handler for Rapid Testing" naming Andreas C. Pfahnl and John D. Moore as inventors.

BACKGROUND

This invention relates generally to the manufacture of semiconductor devices and more specifically to a handling device that thermally conditions devices and presents them to a test system.

In the manufacture of integrated circuit chips, the chips are generally tested at least once. The test results are used in various ways. They can be used to separate good chips from faulty chips. They can also be used to grade parts. For example, chips are usually rated by the maximum speed at which they can operate or by the amount of the data they can store, with the chips having a higher speed or larger memories being sold at higher prices. Often, variations in the chip manufacturing process result in some chips operating at a higher speed or having more usable memory. The test results allow the parts that have greater capabilities to be graded for sale at a higher price. In some cases, defects on chips can be repaired using laser repair stations or similar equipment. Another way that test results might be used in the manufacture of chips is to guide the repair of chips.

Usually, automatic test equipment is used to run the tests. A handling device is used to present the chips to the automatic test system in an automated fashion. A handling device that handles packaged parts is usually referred to as a "handler." To fully test chips, tests are often run at multiple temperatures over the rated operating range of the chip. For example, many chips are tested over a range that spans from −55 deg C. to +155 deg C. The handler, in addition to moving the chips to and from a test station, often heats or cools the parts to the desired test temperature.

The main drawback of present test handler thermal systems, which are mainly convection based, are the long slew times (20 to 60 minutes) and long soak times (>2 minutes). "Slew time" refers to the length of time it takes for the handler to reach the desired operating temperature. "Soak time" refers to the amount of time a chip must be in the handler until it reaches the desired temperature for a test.

A short slew time is important in being able to quickly recover from jams or machine failures, especially during cold testing when the machine must often be reheated to remove frost and condensation. In addition, the slew time and the soak time affect the package changeover time—the time it takes to reconfigure a machine to test a new type of device. The slew time plays a role in that when a package changeover is needed the handler must be brought back to an ambient-level temperature, the hardware and software configuration changes made, and then brought to the desired test temperature. Once the machine reaches temperature, the soak time plays a role in that it defines the time it takes for the first device to reach the test site, if the system is not mechanically limited in speed. Finally, in the case where a new lot of devices is loaded, the soak time plays the dominating role and defines the time it takes for the first device to be tested, if the system is not mechanically limited in speed. The slew time and soak time become even more dominant in describing the overall effectiveness or efficiency of a machine, because the frequency of new lots and changeovers has constantly been increasing.

In addition many convection based thermal systems end up rather large and have trouble with tight temperature control of devices, particularly in the case of high parallel test. Conduction-based thermal systems have in the past been considered for use in test applications. However, they do not provide a means to achieve a high thermal slew rate design that meets the test temperature range and tolerance requirements (−55 deg C. to 155 deg C. and ~±2 deg C.). The greatest use of conduction based thermal systems in test today is in probe applications (wafer test), where a temperature-controlled chuck (thermal chuck) provides a means to support, transport, align, temperature control and test the ICs on a wafer.

Thermal chucks are available commercially such as from Thermonics Incorporated of Santa Clara Calif. and Temptronic Corporation of Newton Mass. These wafer chucks have limited performance capability over the complete hot-and-cold test temperature range. Specifically, their slew-rate performance is limited because they use a closed-loop mechanical refrigeration system needed for clean-room operation. Their slew-rate performance is also limited because the thermal mass of the thermal chuck is too large.

Closed loop refrigeration systems generally can not provide a fast enough and great enough cooling and heating source to achieve the desired short ramp rates (~5 minutes) over the complete −55 deg C. to 155 deg C. temperature range. In addition, these thermal chucks are all single-zone thermal systems, where heating and cooling of the chuck is regulated by feedback from one temperature sensor. In probe applications however, slew rates are not as important because of the much longer time it takes to test a wafer than it takes to test a group of packaged devices; a wafer can hold hundreds of ICs. In addition, all ICs are processed on a very limited number of different wafers, differing only in diameter e.g. 200 mm, 300 mm. Therefore, the number of different chuck designs is very limited, and the only changeover typically is that necessary to change the test interface, probe interface components, or software/test program. On a final note, the soak time is generally much faster for a wafer than it is for a packaged device because of the extremely high surface finish and flatness of a wafer and high thermal conductivity of silicon compared with the properties of traditional packaged devices (e.g. ceramic and "plastic" packaged parts). Given this and the low influence of the soak time, probers are not built with thermal conditioning buffer capacity.

Conduction-based thermal systems in package test (handler applications) have been used, but these were mainly for active temperature control of high-power devices under test, and therefore require feedback of the device or the device die (junction) temperature as in the prior patents by Jones (U.S. Pat. No. 5,420,521) and by Tustaniwskyj (U.S. Pat. No. 5,821,505). This functionality of active temperature control based on device power dissipation is not required for the large majority of ICs which are relatively low-power devices (less than about 10 W), therefore this adds unnecessary cost and control complexity (control-feedback system required and intended for each device). Furthermore, typically only the high-end microprocessor devices have built-in temperature sensors, which could be used for temperature control purposes during test (U.S. Pat. No. 5,821,505). An external control element such as in Jones (U.S. Pat. No. 5,420,521), requires that the sensor align with and contact each device under test. Given the vast nature of device types, achieving alignment of the temperature sensors with each device type/package type is difficult, costly, and time consuming. Finally, these systems as described in Jones (U.S. Pat. No. 5,420,521), Tustaniwskyj (U.S. Pat. No. 5,821,505), and Tustaniwskyj (U.S. Pat. No. 5,844,208) require a clamping action to sandwich the device between the conduction system and the electrical test socket to achieve the necessary pressure between the device and the conduction system. In automation equipment, it is most often necessary and preferred to handle (pick up) and hold devices down using vacuum. The patents by Tustaniwskyj (U.S. Pat. No. 5,821,505) and Tustaniwskyj (U.S. Pat. No. 5,844,208) clearly state that additional mass changes the intention, performance, and nature of their invention.

The conduction-based design by Micro Component Technology Inc. of St. Paul, Minn. in U.S. Pat. No. 5,966,940 requires the use of thermoelectric elements. A "thermoelectric element" refers to a device that will generate heat when a electricity is applied in one direction and will cool when electricity is applied in the opposite direction. These provide a means for some local hot and cold temperature tuning but are relatively expensive, fragile, difficult to assembly in large numbers (necessary for greater cooling/heating capacity), require excessive electricity and greater control-system complexity, and have a limited heating/cooling capacity. Thermo-electric elements also require a heat sink during cold operation. In the prior art this is overcome by implementing a closed-loop heating/refrigeration system, which ends up providing the bulk temperature control. Closed loop refrigeration systems generally can not achieve the desired 5 minute ramp rate over the complete −55 deg C. to 155 deg C. temperature range.

Early handlers operated on single chips that slid on rails through the handler. As devices got smaller, some handlers began to use boats that carried single parts or a small number of parts. Some handlers used trays to carry many loose devices and to present multiple devices to a test site in parallel. An example of a tray type handler is shown in U.S. Pat. No. 6,024,526.

More recently, it has been suggested that a handler should operate on chips before physically severing/separating the devices from the common lead frame or circuit-board substrate. Leaded devices are assembled and packaged in finite groups on a lead frame. Typically grid array devices are manufactured on a flexible or rigid substrate (circuit board) called a strip. Lead frames and strips together are often referred to generically as panels. FIG. 15 illustrates a plurality of IC devices 115 in a lead frame 116. In manufacturing chips, a lead frame or substrate is provided. Some portion of the lead frame or strip is used for the electrical leads and connections, and other portions are used to mechanically hold the devices in place. In the manufacturing process, there are equipment and processes to cut the electrical connections and the mechanical connections. To test devices still attached to a lead frame or a strip, only the electrical connections are severed.

While handlers have been suggested to operated on chips in strips, it would be desirable to have an improved strip type handler.

SUMMARY OF THE INVENTION

With the foregoing background in mind, it is an object of the invention to provide a handler that provides fast slew rate and fast soak times.

It is also an object to provide a handler that can operate on devices in lead frames or strips.

The foregoing and other objects are achieved in a handler having a plate with multiple temperature control zones in intimate contact with chips being tested.

In one embodiment, the plate includes vacuum ports to draw chips in lead frames or strips against the plate.

In another embodiment, the plate has multiple heating or cooling zones.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
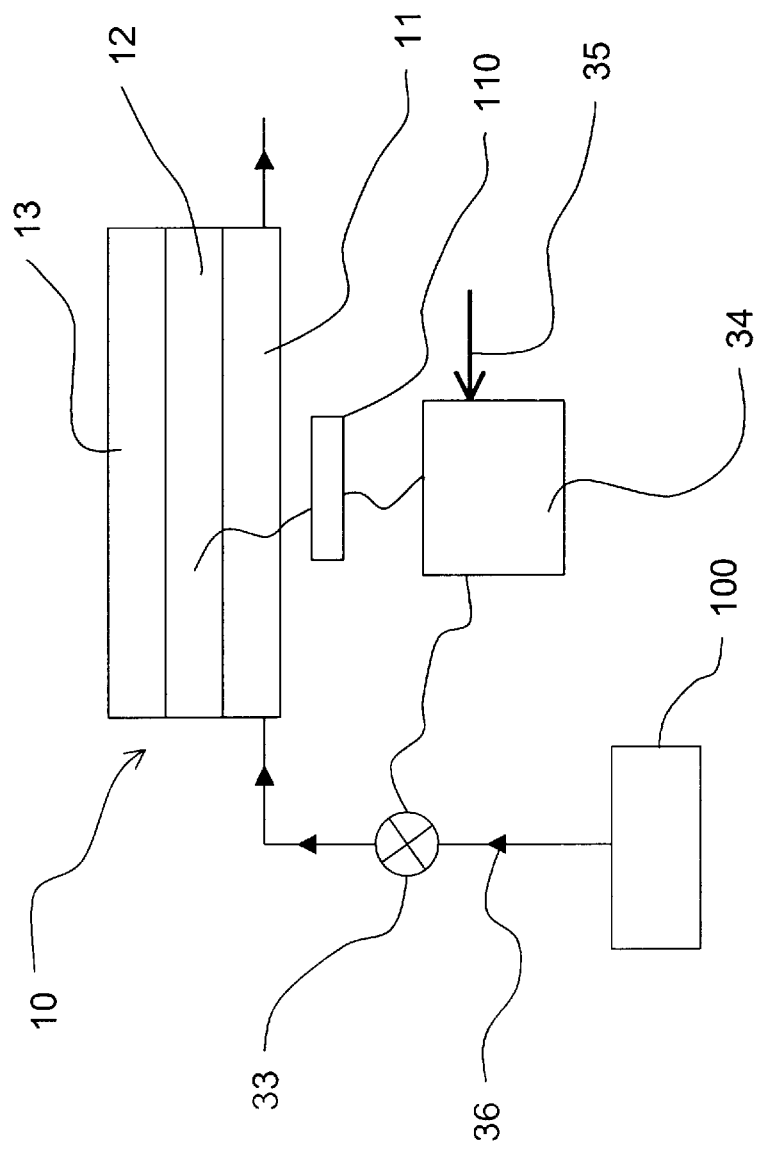
FIG. 1 is a schematic of the layout of the preferred implementation of the invention.

FIG. 1 illustrates the preferred implementation of the invention whose construction and operation is described in detail. The main assemblies of the preferred embodiment include a fluid distribution assembly 11, a heating assembly 12, and a vacuum-based device-hold-down assembly 13 (the last assembly herein called the vacuum assembly), which are all serially arranged one on top of the other. The assemblies 11, 12 and 13 are held together in any convenient means, such as with screws, but could be held together in other ways, such as by brazing or welding.

A control system 34 regulates the flow of cooling fluid from the cooling fluid source 100 into the fluid assembly 11 with a control valve 33 and temperature feedback 35 from one or more sensors (not shown) in the thermal plate assembly 10. Similarly, the control system 34 regulates the amount of heat generated in heater assembly 12. Examples of control schemes that can be used to generate are on-off cycling of a heater in the heater assembly 12 with a linear non-switching DC supply, an AC supply, or a switching (on-off only) DC supply 110.

FIG. 1 shows the flow direction 36 of the cooling fluid. The control valve 33 regulates the flow of heat-transfer fluid. The valve 33 can be a variable control valve or a solenoid valve for continuous regulation of the flow rate. The preferred type is a solenoid valve, e.g. using those manufactured by Precision Dynamics Incorporated of New Britain in Conn., which can be pulsed to regulate the flow. Solenoid valves are lower in cost, relatively small, and sufficiently reliable over the hot and cold temperature operating range.

Figure 2:
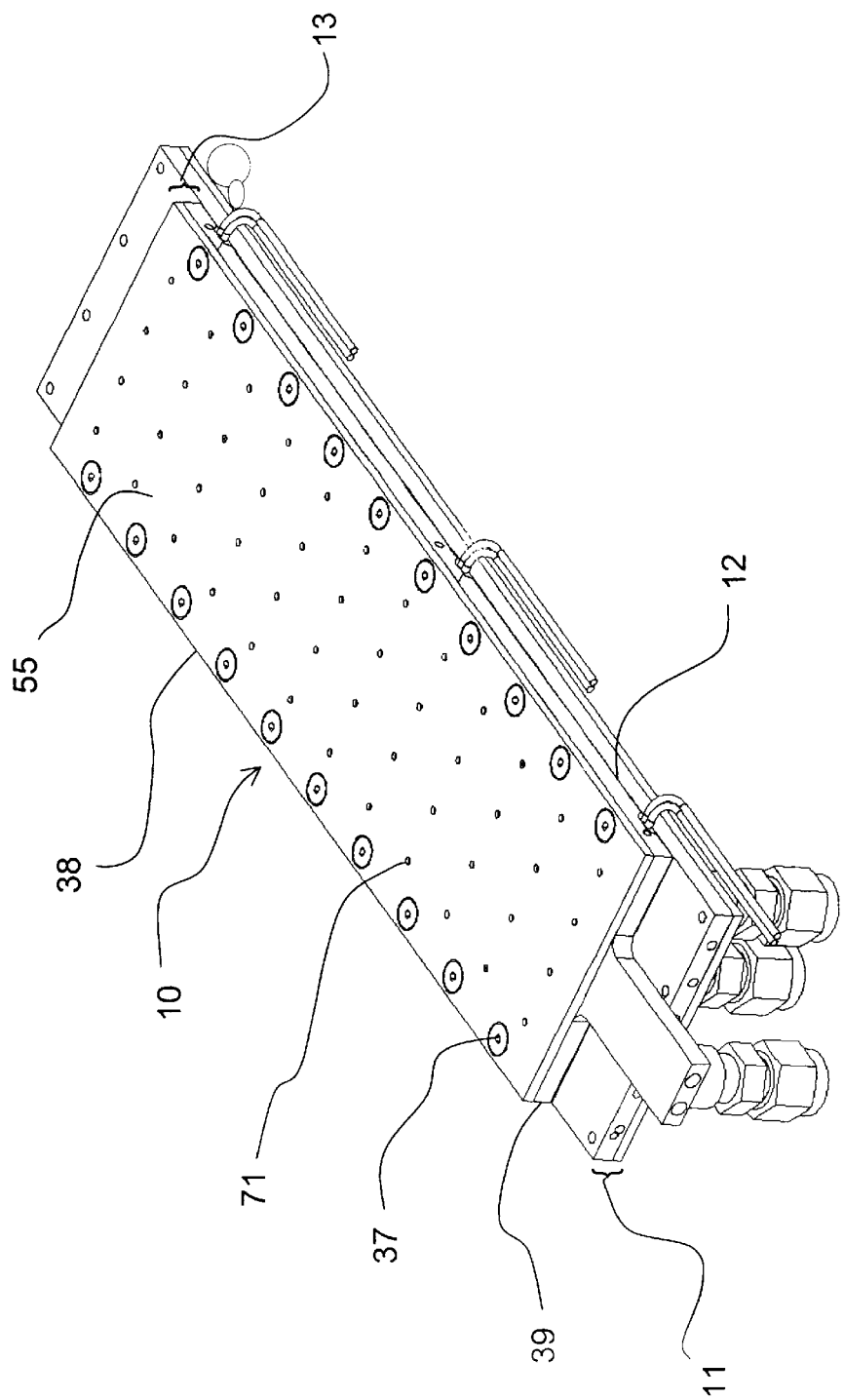
FIG. 2 is an isometric view of the thermal plate invention.

FIG. 2 shows a more detailed illustration of the thermal plate 10. Screws 37 fasten the interchangeable top plate 38 of the vacuum assembly 13 to the lower vacuum plate 39. The IC devices, which would be located on top of each vacuum port 71, are pulled by vacuum against the top surface 55 of the top vacuum plate 38. Screws 14 (shown in FIG. 3) fasten the fluid distribution assembly 11 and heater assembly 12 (which in the illustrated embodiment is a very thin multi-zone electrical resistance heater) to the lower plate 39 of the vacuum assembly. To achieve a fast change in temperature of the thermal plate 10 with minimal energy consumption, the complete thermal mass of the thermal plate 10 must be low. The sizeable heat losses and gains can however induce detrimental temperature gradients in the thermal plate 10, which insulation can not completely overcome. Therefore, the invention uses zoned heating and cooling to achieve high temperature uniformity (better than about 2 deg C.) of the thermal plate 10. This now allows the amount of insulation to be reduced and even eliminated, thereby providing dramatic reductions in material cost and system size (packaging). The zoned heating also allows for a much faster stabilization time when changing temperature. Each of the three main assemblies 11, 12, and 13 are described in greater detail.

Figure 3:
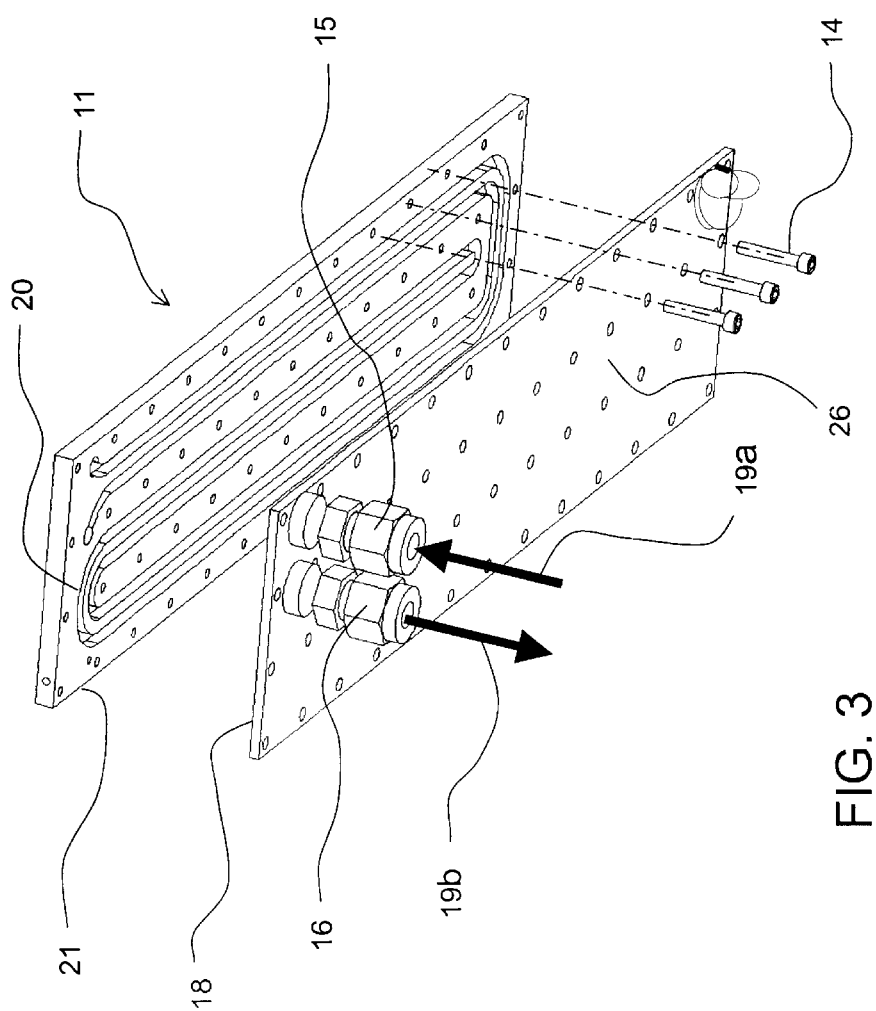
FIG. 3 is an exploded isometric view of the preferred embodiment of the fluid distribution assembly of the thermal plate assembly.

The fluid distribution assembly 11 (also called fluid assembly) of the thermal plate 10 is shown in an exploded view in FIG. 3. Fluid distribution assembly has channels formed within it. In the preferred embodiment, the fluid assembly 11 consists of two plates 18 and 21 held together by screws 14. The function of the two plates is to provide a flow path for a heat exchange fluid, whose flow direction 19a and 19b is shown, and which is what cools the entire thermal plate 10 and is the main source of temperature control during cold-temperature (sub-ambient) operation. The lower fluid plate 18 includes the inlet port 15 and the outlet port 16 for the heat exchange fluid to pass in and out. The lower plate 18 also acts as a cover to seal the fluid passage 20 that is machined into the upper plate 21. These two plates 18 and 21 can be assembled and held together with screws 14 (as shown in this embodiment they screw into the lower vacuum plate 39), or they can be brazed or glued together depending on the materials chosen and the design preferences. If the plates are fastened together, a gasket or seal can be interposed between the two, especially if leakage of the heat transfer fluid is a problem. There are no restrictions on the choice of materials, but a material with a high thermal conductivity and low thermal mass (density and specific heat) is preferred. Aluminum specifically is preferred for its low cost, ease of manufacture, and ideal thermal properties. The fluid assembly 11 is also the component of this thermal plate 10 to which the structure is mounted to a support stand or other structure such as a robot. Specifically, the mounting surface 26 may have bosses or other features (none shown) to facilitate the mounting. The general design of the fluid passage 20 follows standard heat-exchanger design practice as outlined in heat-transfer texts (see for example *Heat-Transfer Handbook* by Rohsenow et al., which is hereby incorporated by reference). The flexibility that the construction of the invention allows in the thermal design is described further.

Figure 4:
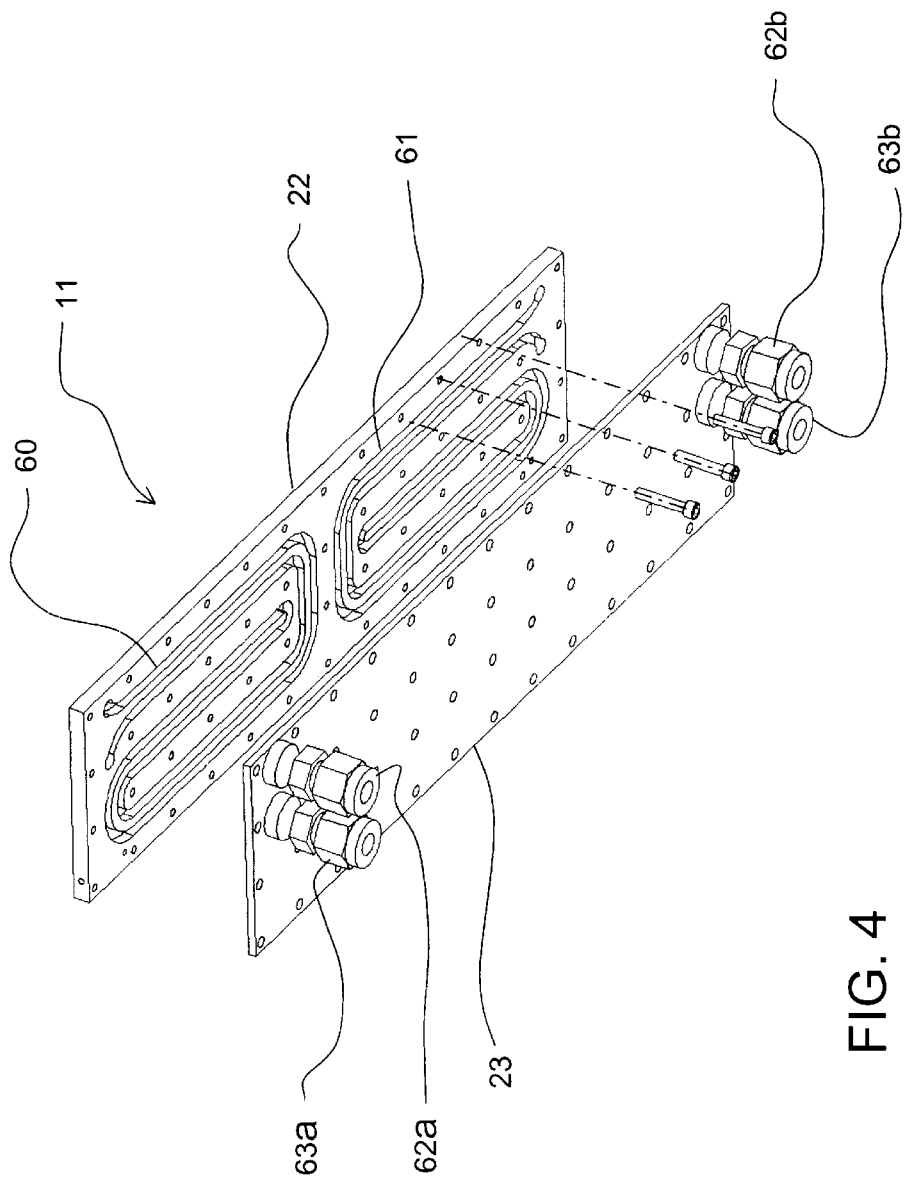
FIG. 4 is another embodiment of the fluid distribution assembly of the thermal plate assembly.
Figure 5:
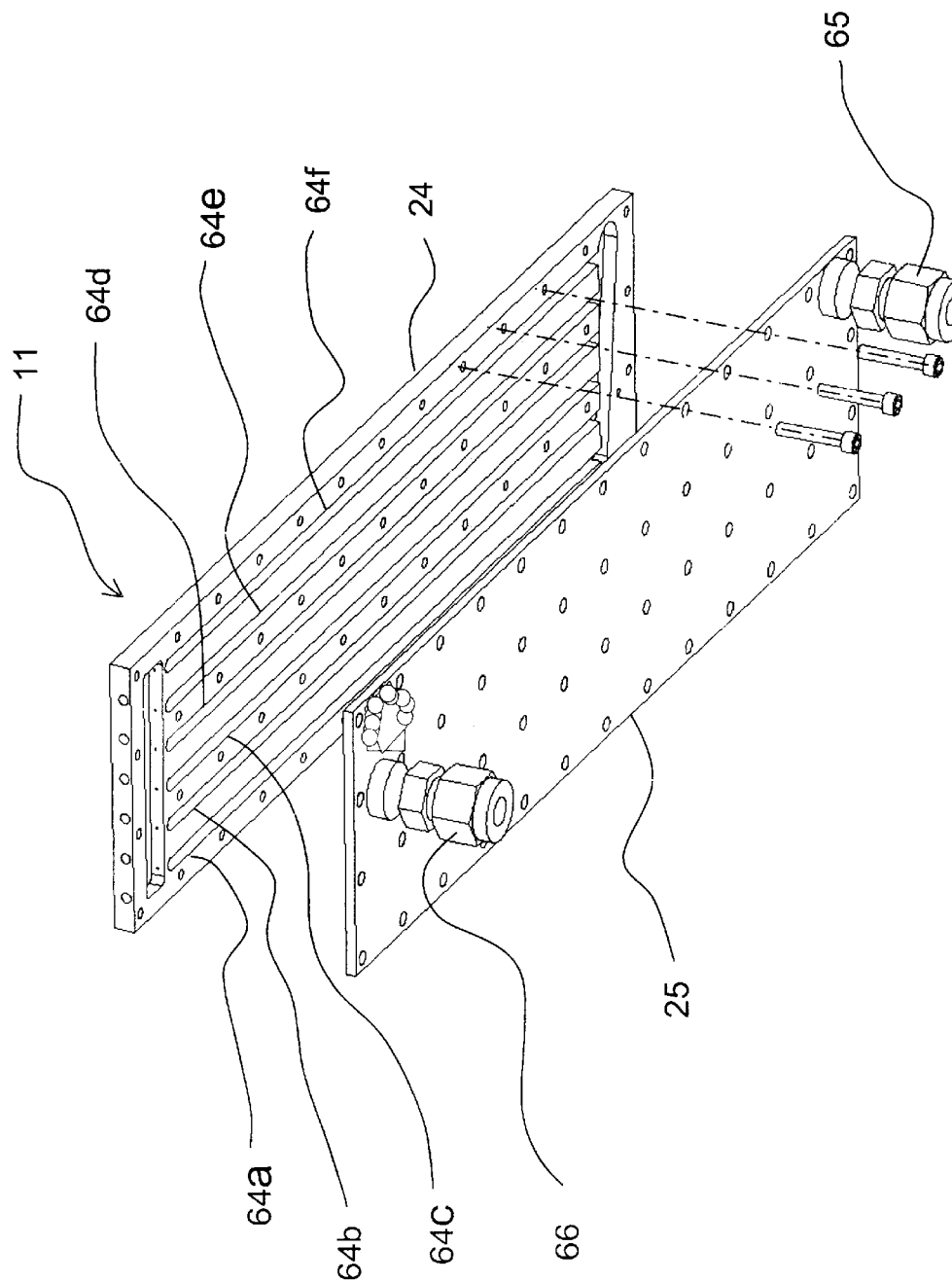
FIG. 5 is another embodiment of the fluid distribution assembly of the thermal plate assembly.

The fluid passage 20 as shown in the embodiment of FIG. 3 is a single winding channel. The fluid assembly 11 can also be made with multiple channels as FIG. 4 illustrates. In this embodiment, the lower fluid plate 23 seals the channels 60 and 61 of the upper fluid plate 22, and includes the inlet ports 62a and 62b and outlet ports 63a and 63b for each channel. FIG. 5 then illustrates another embodiment of the fluid assembly 11 with multiple channels 64a, 64b, 64c, 64d, 64e, and 64f all machined into the upper plate 24, and originating from the same supply port 65 and discharging into the same exit port 66.

The fluid passages 20 can have any cross-sectional shape, but the preferred shape is rectangular or square, since that is the shape that results if the passages are machined into the upper fluid plate 21, 22, or 24 with a typical end mill. The passages 20 can also have fins or other extensions into the flow channel to provide heat-transfer enhancement by enhancing or inducing mixing, or providing an increase in the exposed surface area.

Figure 6:
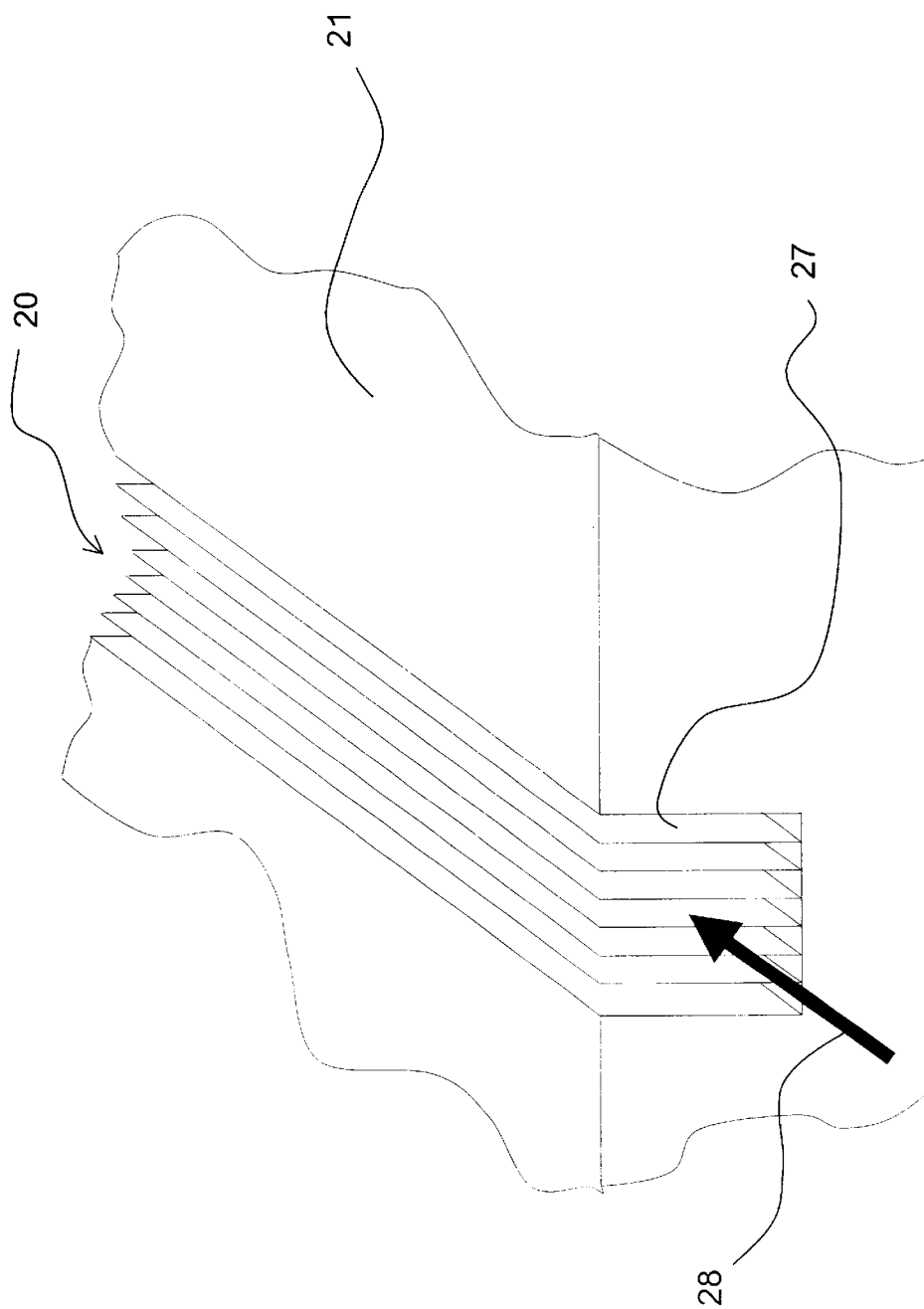
FIG. 6 is a cutaway view of a fluid passage of the fluid distribution assembly with heat-transfer enhancing fins.

FIG. 6 illustrates an embodiment with fins to increase thermal transfer. FIG. 6 shows a section of fluid passage 20 that is machined into the upper fluid distribution plate 21, 22, or 24, but now with fins 27, which align with the flow direction 28. These fins 27 enhance the heat transfer by increasing the interior surface area of the channel 20 exposed to the fluid passing through the channel 20.

Figure 7:
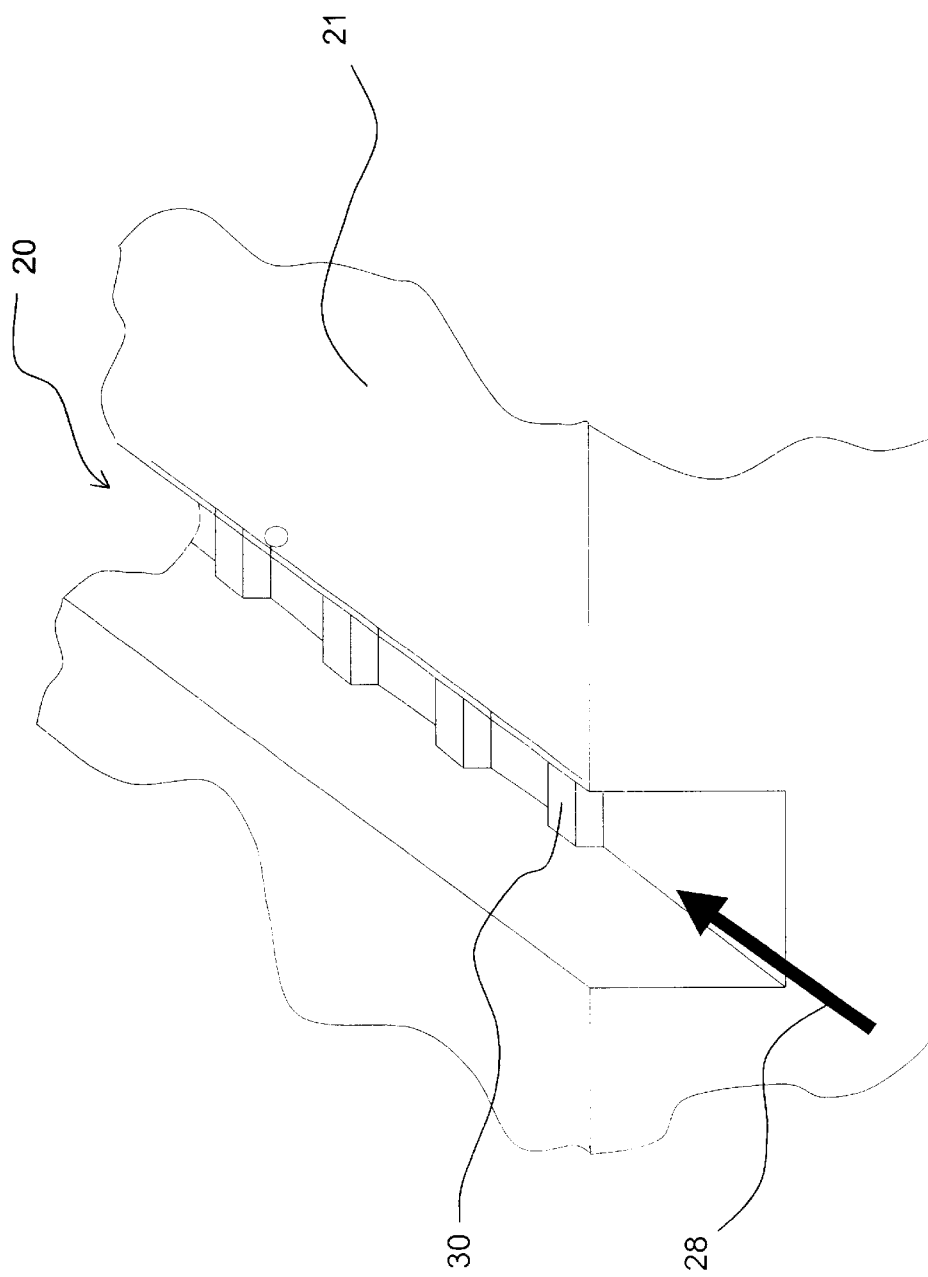
FIG. 7 is a cutaway view of a fluid passage of the fluid distribution assembly with heat-transfer enhancing ribs.

FIG. 7 illustrates an alternative embodiment in which a fluid passage 20 that is machined into the upper fluid distribution plate 21, 22, or 24, but now with rib features 30 that are aligned transverse to the flow direction 28. These ribs 30 mainly provide heat-transfer enhancement by enhancing the mixing between fluid close to the channel surface with that in the middle (also called bulk).

Figure 8:
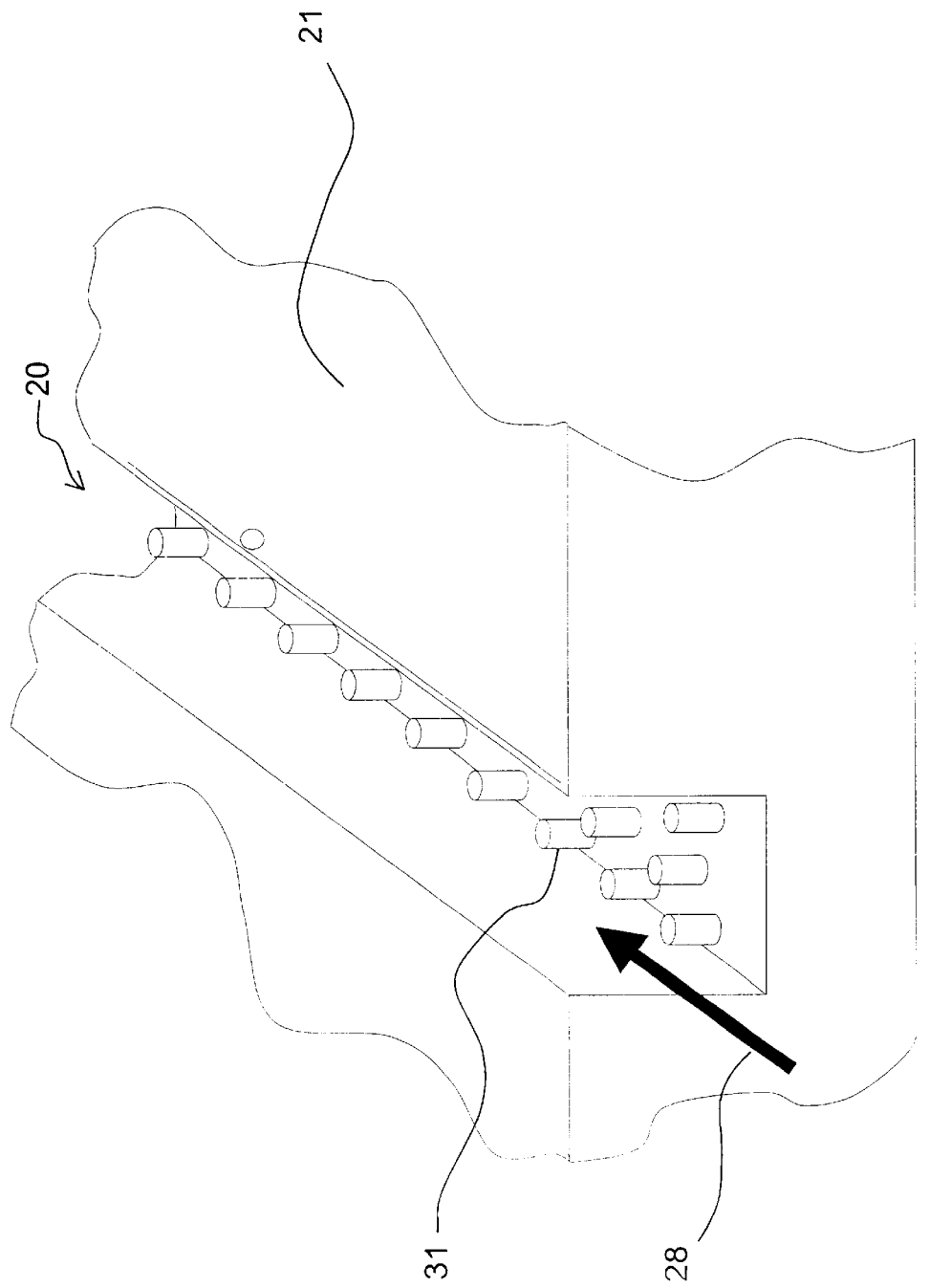
FIG. 8 is a cutaway view of a fluid passage of the fluid distribution assembly with heat-transfer enhancing pin fins.

FIG. 8 illustrates yet another embodiment in which fluid passage 20 is machined into the upper fluid distribution plate 21, 22, or 24, but now with "pin" type extensions 31. These pins also provide heat-transfer augmentation by a combination of the previous two enhancement methods. Other heat-transfer enhancement features exist, but are not further discussed. The design of fins or other extensions in flow passages to enhance heat-transfer and is common practice known to those skilled in the art of heat-exchanger design (see for example *Heat-Transfer Handbook* by Rohsenow et al.). The plate-type construction of the fluid distribution assembly 13 that is part of this invention provides the means to incorporate such desirable features.

Figure 9:
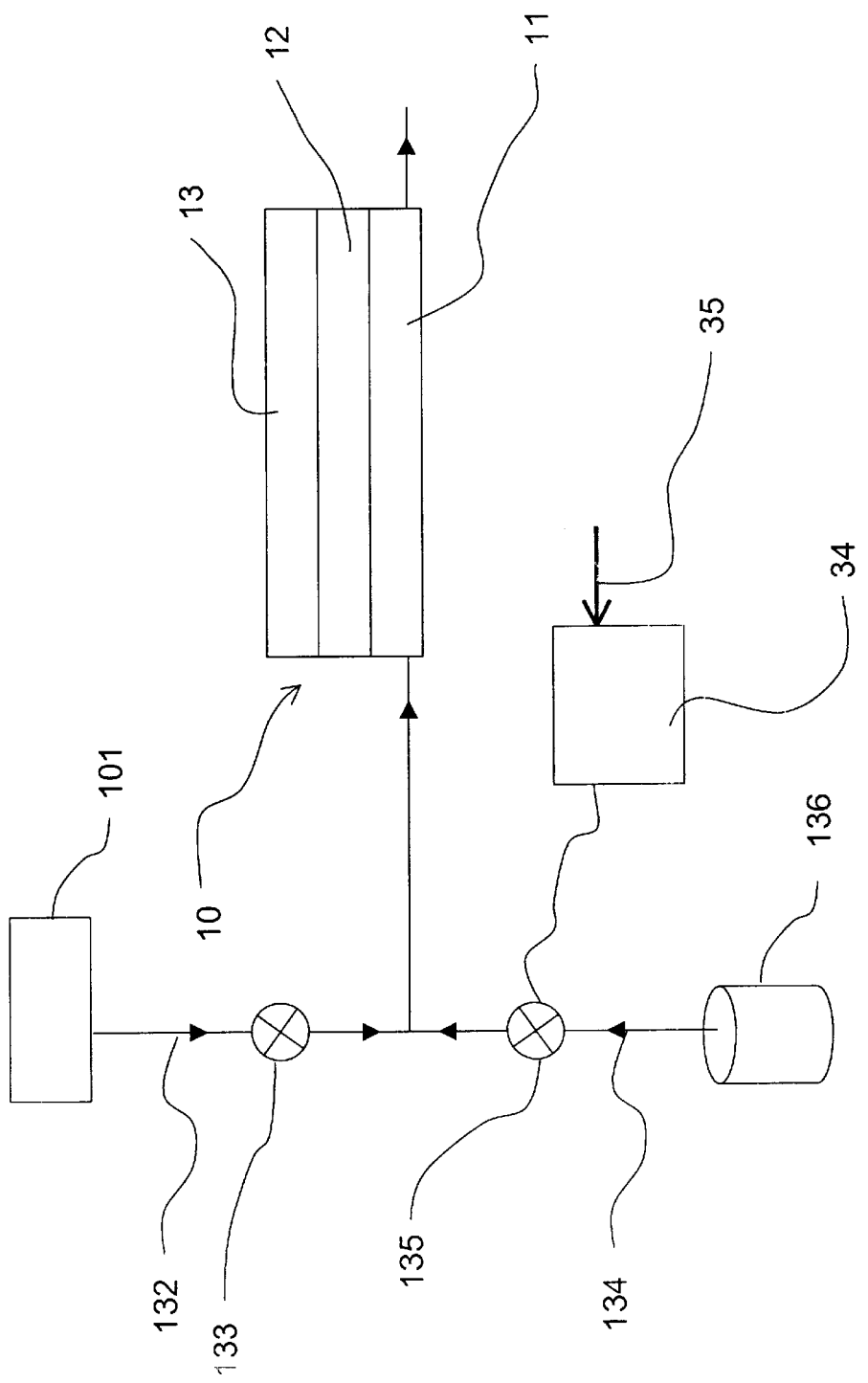
FIG. 9 is a schematic of the layout of the implementation of the invention with two fluid sources.

The passages 20 can be designed for single-phase flow (forced convection) or for multi-phase flow (forced-convection and boiling of the liquid within them, such as water, a refrigerant, or a cryogen). If a cryogen is used, for example, then the flow passage can also be used with multiple types of fluids as FIG. 9 shows. This feature of the invention allows the thermal plate 10 to be flexible in adapting to different user preferences, and system and factory requirements.

It is not required that the fluid used in fluid distribution system be a liquid. Air or other gas could be a "fluid" for purposes of the invention. In the embodiment of FIG. 9, the fluid distribution assembly uses the room temperature air 132 provided by a compressed air source 101 and controlled by valve 133 for operation between ambient and 160 deg C. (embedded heaters discussed later provided the capability for high temperature operation). Compressed air is routinely provided in many manufacturing operations and can be provided in any known way, such as a compressor built into the handler or from an in-plant system to which the handler is connected.

The liquid nitrogen (LN2) flow 134 provided by the LN2 source such as a dewar 136 is activated for sub-ambient temperature operation and regulated by the valve 135. LN2 is also used in many industrial settings and can come from any convenient source.

The thermal plate 10 is similar to that of the previous embodiments with a vacuum assembly 13, a heater assembly 12, and a fluid distribution assembly 11. The valves 133 and 135 are controlled in a similar scheme as described before with controller 34 using temperature feedback 35 from the thermal plate 10. This arrangement helps minimize the use of the costly liquid nitrogen. Commercially available on-off (solenoid type) or proportional control valves 133 and 135 in conjunction with a control system regulate the flow of the fluids based on temperature feedback from the thermal plate 10. It should be noted that an optimal passage design with respect to heat-transfer performance, pressure drop performance, passage geometry, and length may not be possible for this fluid distribution assembly, but the system would still function very well.

When there is a need or desire for supplemental cooling using a secondary fluid source, but in a case where the fluids can not mix, then the thermal plate 10 can be modified to have an intermingling flow distribution assembly or a stacked fluid distribution system. "Intermingling" means that the passages run near each other, but does not necessarily imply that the fluids in each passage mix.

One instance where multiple fluid sources might be desirable is when different types of fluid might be used for cooling in different temperature ranges. For example, when thermal plate 10 is at an elevated temperature, compressed air might be used as a cooling fluid to rapidly cool thermal plate 10 to ambient. Compressed air could conversely be used to quickly raise the temperature of thermal plate 10 to ambient as well. However, if cooling is required to sub-ambient, LN2 might be used. Or if a slight drop in temperature is required, a refrigerant might be used.

Different fluids might also be desirable to provide lower operating cost or to provide fast slew rates. For example, LN2 or some other cryogen might be used in an open loop fashion to rapidly cool thermal plate 10 to sub-ambient temperature. However, once the desired temperature is reached, a closed loop refrigerant might be used to maintain the desired temperature. The intermingling passages allow different types of fluids to be used for temperature control.

Figure 10:
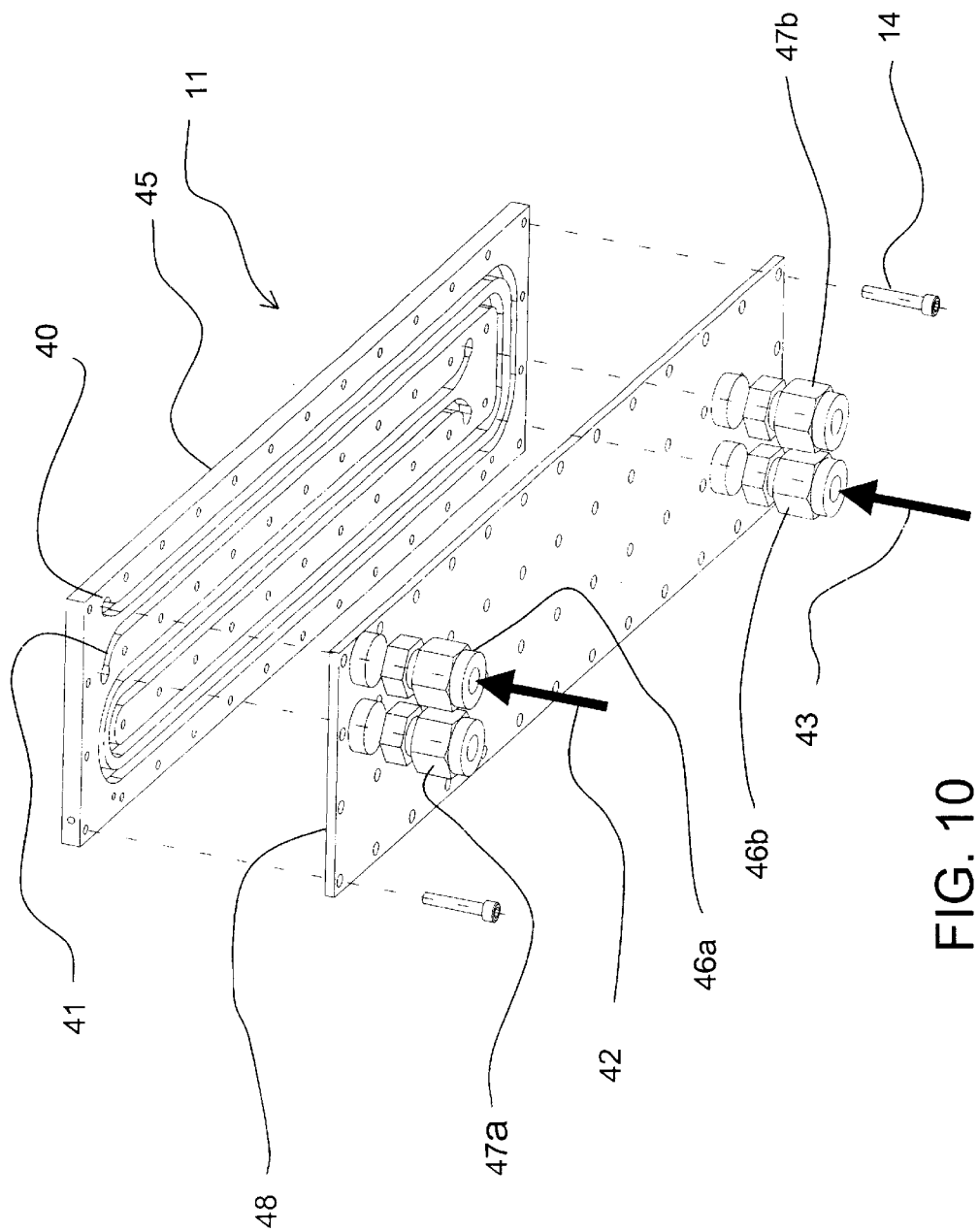
FIG. 10 is an exploded isometric view of the preferred embodiment of the fluid distribution assembly of the thermal plate assembly for use with two intermingling but not mixing fluids.

FIG. 10 illustrates the flow distribution assembly 11 in an embodiment with intermingling flow passages 40 and 41 machined into the upper plate 45. The inlet ports 46a and 46b, and outlet ports 47a and 47b are part of the lower plate 48 which is clamped with the upper plate 45 and the remaining assemblies of the thermal plate 10 using the screws 14. As in FIG. 10, a closed-loop refrigeration system (not shown) could provide the first cooling fluid whose flow direction is shown as 42. This cooling fluid is typically a heat transfer oil that can withstand the hot and cold temperatures such as Syltherm manufactured by Dow Chemical of Newark Del. In some applications it can also be a common refrigerant. The second flow passage 41 is in the same elevation as the first passage 40 and is hence called intermingling. The second flow passage 41 provides a means for a very cold fluid whose flow direction is shown as 43, preferably a cryogen like liquid nitrogen, to flow through the fluid distribution assembly 11. The second flow 43 is much colder than the first flow 42, preferably by about 100 deg C. or more. The second flow 43 is only activated to provide supplemental cooling to the main flow 42. The reason this is necessary is that most closed-loop mechanical refrigeration systems generally can not provide a fluid at a cold enough temperature and deliver a high enough flow rate to rapidly change the temperature of the thermal plate 10 in the desired 5 minutes. Such systems are typically limited to about −40 deg C. fluid temperature whereas cryogens can go below −195 deg C. Therefore, the flow of a second very cold fluid 43 through the thermal plate 10 (such as the liquid nitrogen which can be supplied from a pressurized dewar) allows the thermal plate 10 to cool and transition to a lower temperature much more rapidly.

Figure 11:
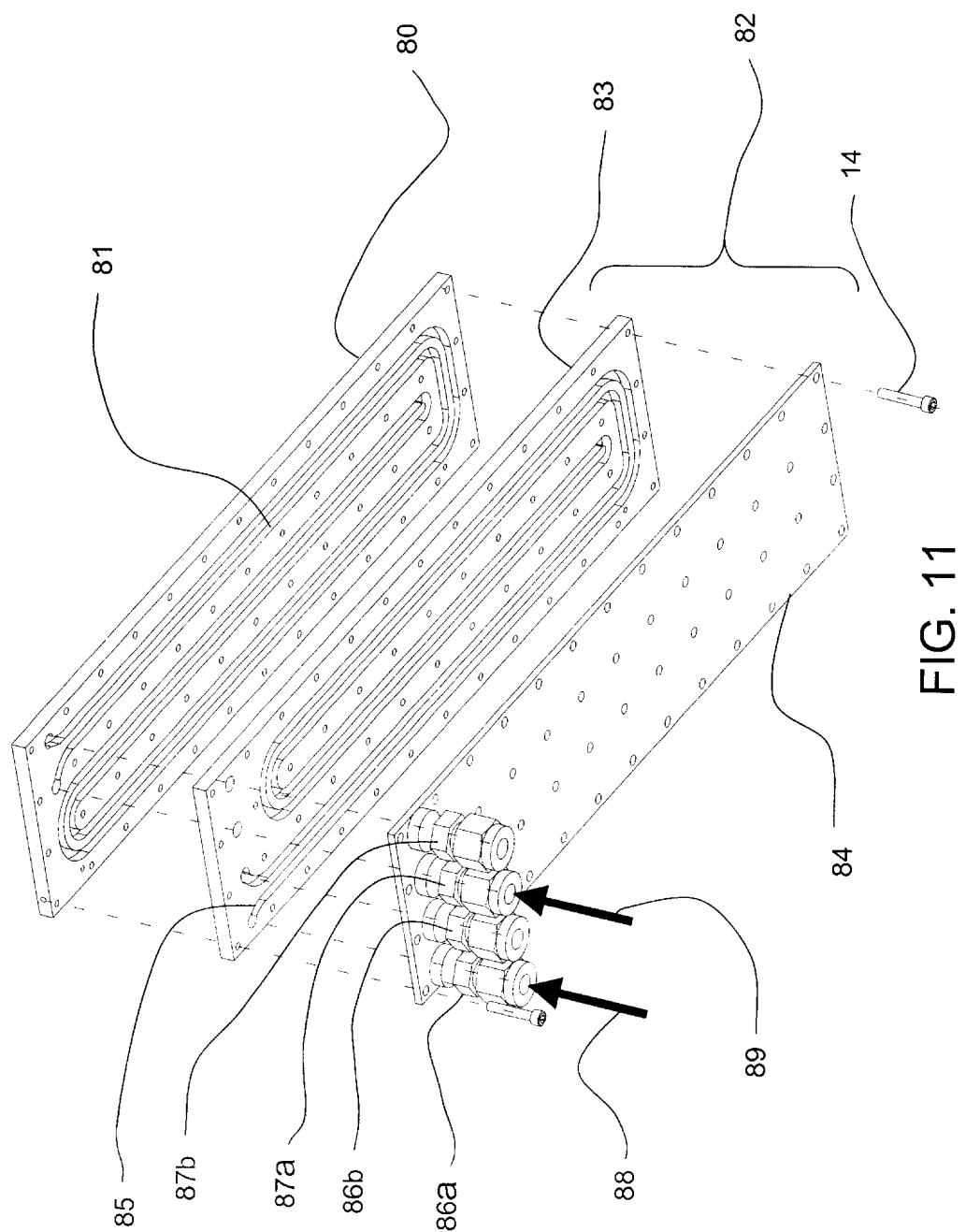
FIG. 11 is an exploded isometric view of the preferred embodiment with two fluid distribution assemblies.

It is not necessary that intermingling channels be formed in the same plate in order to use different types of fluid in fluid distribution assembly 11. FIG. 11 illustrates another embodiment in which there are two fluid distribution assemblies as part of the complete thermal plate assembly 10, referred to earlier as a stacked scenario. In this case, the first flow distribution assembly 80 is merely a plate with a machined flow passage 81. The second flow distribution assembly 82 consists of an upper pate 83 with a machined flow passage 85 and a lower plate 84. The lower plate 84 has inlet ports 86a and 87a, and outlet ports 86b and 87b. The flow direction for each of the two flows is shown as 88 and 89. Screws 14 clamp all three plates together against the other assemblies (none shown) of the complete thermal plate 10. By not having the flows 88 and 89 intermingle, additional mass is introduced by the addition of the thermal distribution assembly 80 which could slow the system's speed in changing temperature, but might be desirable for ease of manufacture.

FIG. 11 illustrates the second flow distribution assembly 82 below the first one 80. There is no required order in which the two flow assemblies 80 and 82 must be attached—one can be on top of the other.

Figure 12:
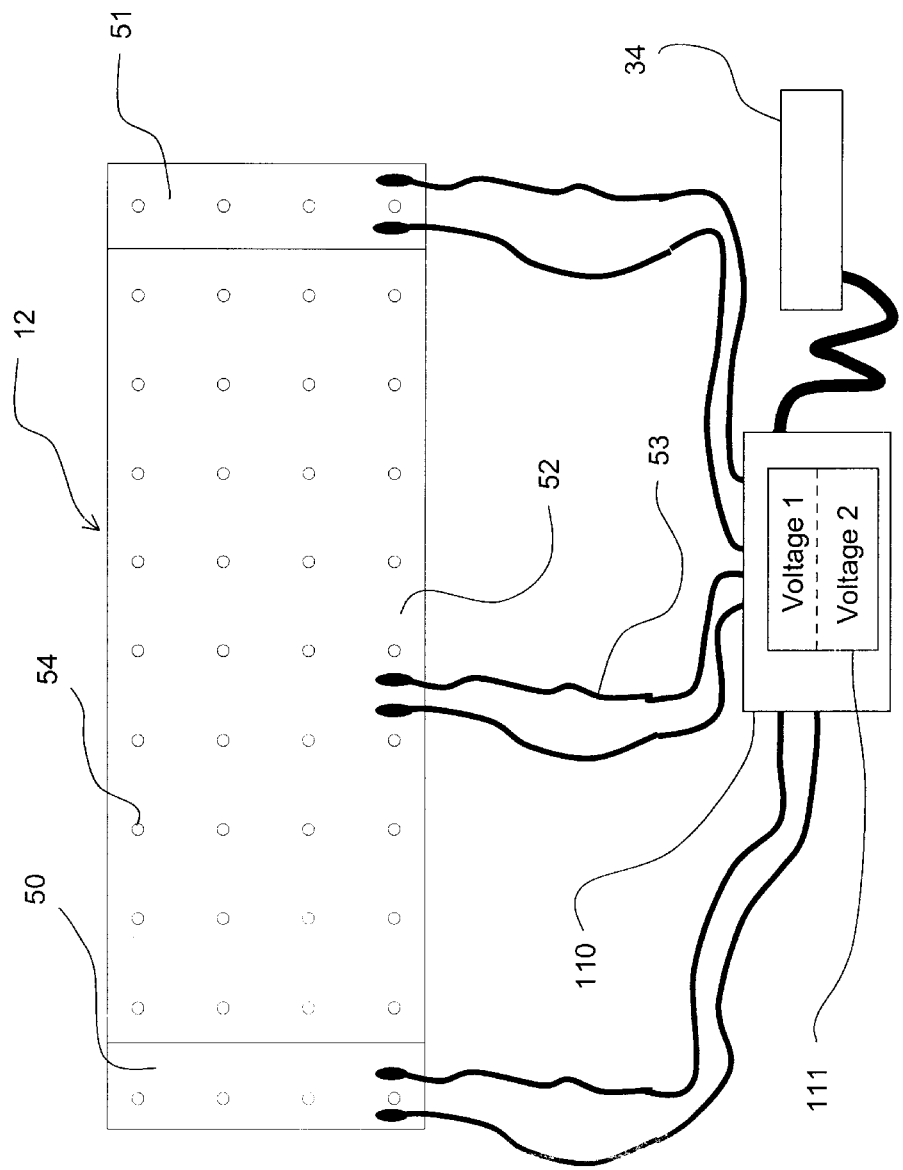
FIG. 12 is a top view of the three-zone heater of the heater assembly.

The heater assembly 12 of the thermal plate 10 in FIG. 3 is a flexible heater type and is shown separately in FIG. 12. The preferred type is a Kapton etched-foil type heater, as this heater is low in mass being only 0.01" thick, cost-effective to manufacture, and commercially available. The heater can be one monolithic unit and still have multiple electrical circuits to provide zoned heating across the thermal plate 10. Another heater type that can be used is called "flexible silicon" with an etched-foil circuit or a wire-wound circuit. The Kapton type is preferred because it has the highest operating temperature—as high as 200 deg C.—and provides the greatest Watt-density level. Another heater type that can be used is a thick-film technology based heater like those manufactured by Watlow of St. Louis Mo. Finally, a heater can be made on a wafer—the way a semiconductor chip can act as a heat source.

FIG. 12 illustrates a 3-zone or 3-circuit heater. The two end zones 50 and 51 temperature control the ends of the thermal plate assembly 10 which are subject to greater heat loss and gains due to the larger surface area and location of fittings and connections. The third zone 52 is in the middle. Each heater has electrical connections 53. The holes 54 allow the fastening screws 14 (shown for example in FIG. 3) to pass through to the vacuum distribution assembly. The heater can be controlled with a linear non-switching DC supply, an AC supply, or a switching (on-off only) DC supply 110 regulated by a controller 34 (see also FIG. 1), or by any other convenient means. Temperature sensors are preferably integrated into the thermal plate 10 to provide feedback signals to control system 34, as is conventional in the art. There would ideally be at least one temperature sensor for each zone of thermal plate 10.

For proper performance and to avoid heater burn out, the heater must be in good thermal contact with the fluid assembly 11 and vacuum plate assembly 13 both shown in FIG. 3. Therefore, the preferred means for attachment is to clamp the heater between the vacuum assembly 13 and the fluid distribution assembly 11. The heater could also be placed below the fluid distribution assembly 11 and clamped with a separate heater clamp plate.

The heater could also be manufactured with integral temperature sensors such as thermocouples. This is commonly done with these types of heaters. However, in this invention, it is preferred to locate the temperature sensors closer to the top surface 55 (see FIG. 2) where the devices under test will be in contact. A desirable location is embedded in the lower vacuum plate 39. Other heating element types such as cartridge heaters can be cast into a plate and clamped between the vacuum distribution assembly 13 and the fluid distribution assembly 11. However, the significantly larger mass of these types of heaters, and the added mass of the plate in which they would be cast does not make them a preferred choice in this application.

The heater(s) can be operated in a two-mode manner to prevent the peak power consumption of the entire handler from exceeding power sources readily available in many manufacturing settings. For the thermal plate 10 described in FIG. 2, the overall geometry is about 254 mm by 63.5 mm by 12.7 mm. A typical handler may have up to about 10 of these thermal plates 10. For this geometry, the required heating capacity to ramp the plate in less than 5 minutes is about 600 W. The steady-state operating load however is only about at most 250 W. Therefore, to minimize or limit the peak power consumption (many manufacturing machines are limited to 208 Volts and 30 Amperes, or about 6 kW), the heaters can be operated with an electrical switching unit. The switching unit 111 shown as an optional part of the heater power supply 110 in FIG. 12 provides the ability to change the voltage source to the heaters. In the case of two voltage sources, the first one may be at 208 Volts and the second one at 120 Volts as illustrated in FIG. 12. Therefore, whenever the machine is idle (motors and actuators for example are still) almost the entire available power to the machine can be used by the heaters so that the temperature of the thermal plates 10 can be rapidly changed. Whenever the system is operational (with motors and actuators operating), the system switches to the lower heater supply voltage, and the heaters are operated at the lower power capacity to hold temperature or change temperature at a much slower rate. This technique allows both heaters and additional systems to operate together without exceeding the typical peak power limits.

Power control can also be achieved by other means, for example by attaching a second heater assembly to the fluid distribution assembly 13 of the thermal plate 10. Whenever a rapid change in temperature is desired (which is when the system is idle—no motors or actuators operating), the large power heater assembly is activated. And, during normal operation the low power heater assembly is operated. The downside to this method that makes it not the preferred implementation is that the second heater assembly adds thermal mass to the complete thermal plate assembly 10 raising the overall needed heater power and cooling capacity.

Control system 34, using known technology, can control the peak power usage.

Control system, might for example, reduce the power dedicated to heating when motors or actuators are drawing power. On the other hand, control system 34 might disable the motors or actuators when the heating unit is drawing peak power.

Figure 13:
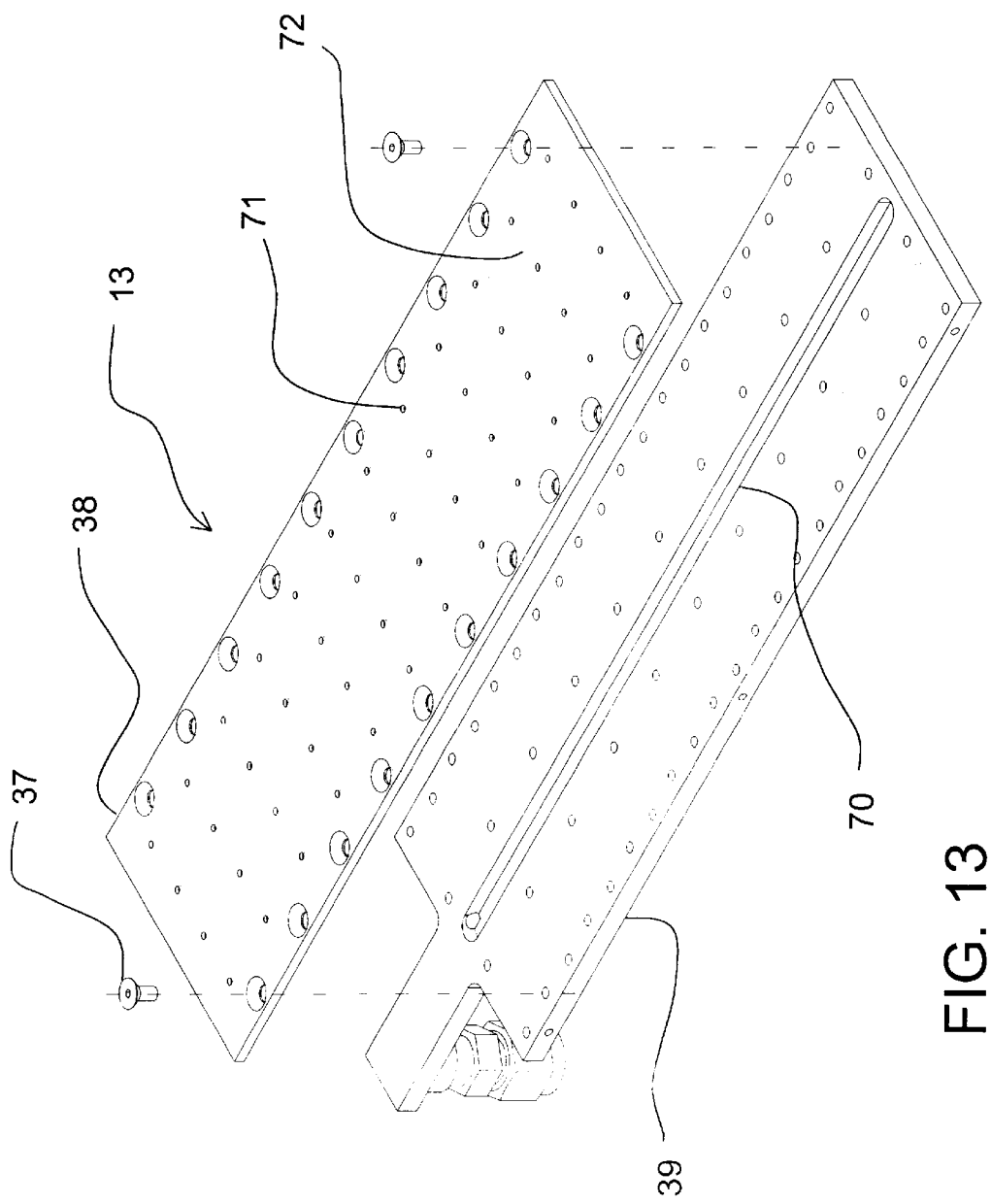
FIG. 13 is an exploded isometric view of the preferred embodiment of the vacuum distribution assembly of the thermal plate assembly.
Figure 15:
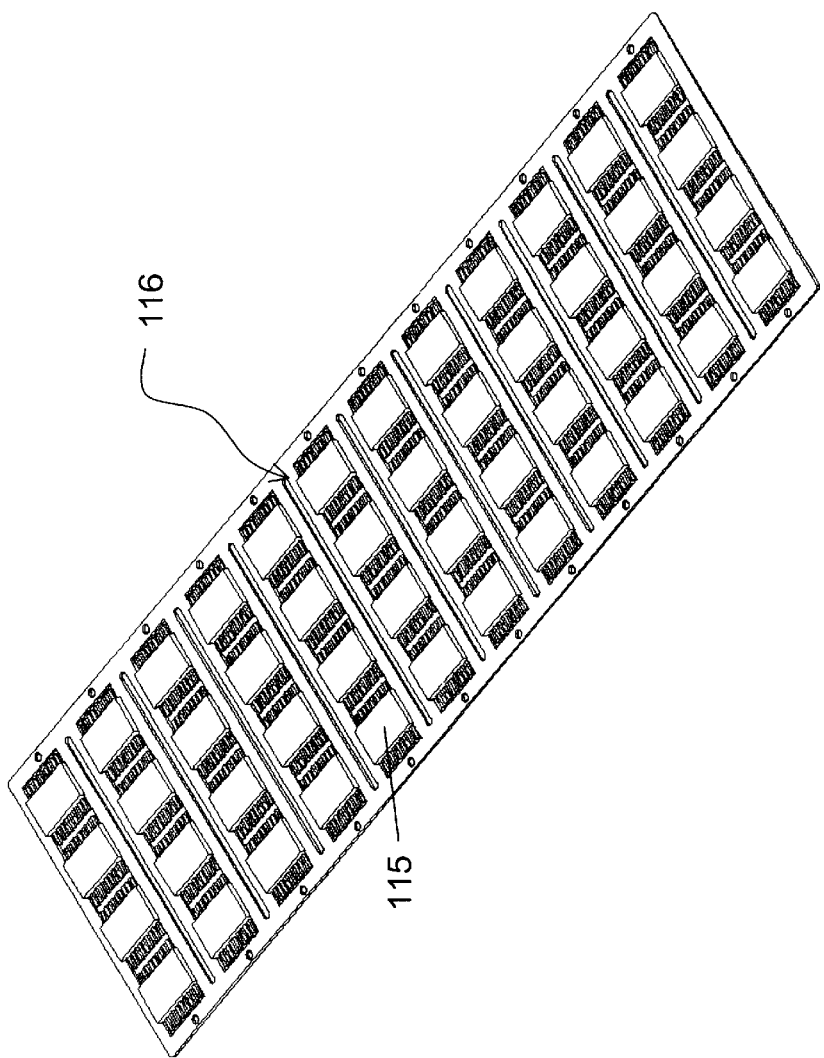
FIG. 15 illustrates a prior art lead frame of chips.

The vacuum distribution assembly 13 is shown in FIG. 13. In this embodiment, the vacuum assembly 13 consists of two plates, an upper vacuum plate 38 and a lower vacuum plate 39, that discretely distribute the flow to each of the devices being held in place. The upper plate 38 is fastened to the lower plate 39 preferably in a way that is easily detachable. In the illustrated embodiment, a series of screws 37 is used to make a detachable connection. The lower vacuum plate 39 acts as a manifold and provides a main vacuum plenum 70. This allows different upper vacuum plates 38 to be used in conjunction with one common lower vacuum plate 39. The upper vacuum plate 38 has an array of machined holes 71 that are linked by a smaller channel 72 also machined into the upper vacuum plate 38. The vacuum ports 71 would align with each device 115 of the sample leadframe 116 shown in FIG. 15 so that the leadframe of devices is pulled and held against the upper vacuum plate 38. When the vacuum plates 38 and 39 are stacked and fastened together, these channels 72 then connect the holes 71 to the main vacuum plenum 70. In this fashion, the top plate 38 can be easily removed and swapped with another one that has a different configuration of holes 71. The top vacuum plate 38 may also be a piece of porous material such as a porous aluminum sold by Advanced Ceramics Corporation of Lakewood Ohio, thereby making it independent of the device shape or device array configuration. In some instances, the upper plate 38, whether with holes or as a porous material, may have surface features integral or as separate entities that provide functions for locating the devices or supporting the leads of leaded devices, for example. The vacuum plate assembly 13 can be made of any material, but the preferred material is aluminum because of its higher thermal conductivity, good stiffness, good machineability, and low cost.

Figure 14:
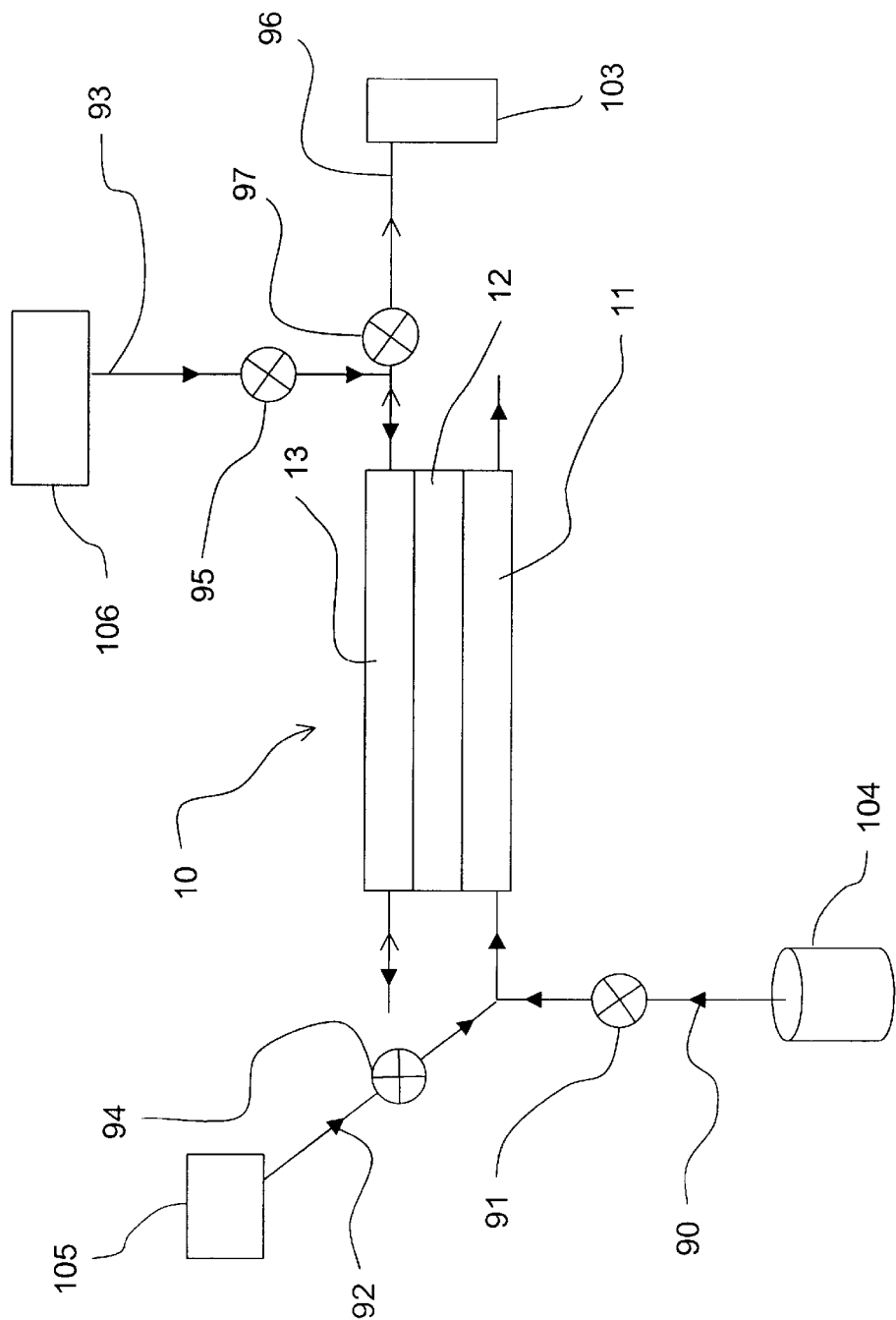
FIG. 14 is schematic of the layout of the implementation of the invention with a liquid nitrogen source, a vacuum source, and two compressed air flows for cooling.

Finally, in FIG. 14 a preferred implementation of the thermal plate 10 is shown for minimizing the use of a cryogen. The vacuum assembly 13 operates with vacuum 96, provided by vacuum source 103, controlled by solenoid valve 97. In the preferred case, the fluid distribution assembly 11 of the thermal plate 10 is designed to operate with liquid nitrogen 90 provided by an LN2 source such as a dewar 104 and controlled by solenoid valve 91 for below-ambient operation. For testing at temperatures between ambient and 160 deg C., it is often undesirable to use any liquid nitrogen. Yet, it is still very desirable to be able to rapidly cool and heat the thermal plate 10 in the test temperature range between ambient and 160 deg C. The method for achieving a very short cool-down ramp time (about 5 minutes) during operation between ambient and hot temperatures is to use compressed air. Compressed air is readily available in most factories. When it is not available, a compressed air source can be installed in the handler, using for example a low-cost HVLP (high-volume low-pressure) unit such as the URBO-DRYER from Lexaire of Arlington in Mass. During cold-temperature operation, the liquid nitrogen 90 and heater assembly 12 control the temperature of the thermal plate assembly 10. Airflows 92 and 93 are provided by compressed air sources 105 and 106 and controlled by valves 94 and 95 respectively. In this case the valves 94 and 95 are not activated. During operation between ambient and hot the airflow 92 may be activated if so desired to improve temperature controllability. During cool down, the heaters in heater assembly 12 are shutdown as well as the vacuum 96, and the airflows 92 and 93 are both activated. For those skilled in the art of heat-exchanger design, it is well known that the response of the thermal plate 10 will depend on the temperature of the compressed air 92 and 93 being supplied and the net flow rate through the plate.

The handlers made as described above have several important advantages. One advantage is that they are capable of providing fast slew times, and quick soak times, even with a relatively small footprint. A small footprint is important for a semiconductor handler because of the high square foot cost of semiconductor manufacturing facilities.

The heat transfer capabilities of a convection heat transfer system are expected to provide device soak times on the order of 30 seconds, in comparison to approximately 120 seconds for conventional handler type systems. They are also expected to provide slew times on the order of 5 minutes as compared to approximately 20 minutes to 60 minutes for conventional systems. These advantages are achieved through the multi-zone heating/cooling arrangement that allows for a very low thermal mass and systems that can control the amount of heat added or removed from the system.

While thermoelectric elements might be used for heating and cooling, the system as described above advantageously can operate very effectively without them.

Moreover, the system provides a reduced peak power usage through the use of lower voltage levels applied to heating elements when mechanical components of the handler are drawing power or other power control mechanisms.

Having described one embodiment, numerous alternative embodiments or variations might be made. For example, the specific control mechanism implement by controller 34 was not described. However, such control systems are well known. In general, though, when the temperature of thermal plate 10 is below some "dead band" around the desired temperature set point, heat will be provided by turning on the heaters. Conversely, when the temperature is above the dead band around the desired set point, the flow of cooling fluid will increase. In the preferred embodiment, the dead band will be about 4 deg C. or less, meaning that the temperature of parts under test will be controlled to within +/−2 deg C. of the desired temperature. When thermal plate 10 is in the dead zone, ideally, no heating or cooling will be supplied.

It will be appreciated that temperature control might be achieved by reducing the flow of cooling fluid instead of or in addition to increasing heat, or reducing heat instead of or in addition to increasing cooling flow.

Also, the preferred embodiment describes that fluid flow is used for cooling. It will be appreciated that a fluid flow could also be used to heat thermal plate 10. A separate channel for a heated fluid might be provided. Alternatively, a single channel might be used with the fluid in the channel being alternatively heated or cooled as appropriate. Rapid temperature changes might be provided through separate reservoirs for hot and cold fluids.

Also, the specifics of a handling system in which thermal plate 10 is used are not expressly shown. It is intended that thermal plate 10 be used in any kind of handler. It is contemplated that thermal plate 10 would be mounted on a plunger assembly that would press semiconductor components on the upper surface of thermal plate 10 into contactors for testing.

The presently preferred embodiment is in a strip or leadframe type handler also called a panel handler. Mechanical mechanisms would be required to position a strip of semiconductor components on the upper surface of thermal plate 10. A vacuum drawn through vacuum assembly 13 would ensure good contact between the components and thermal plate 10 to ensure the parts are at the required temperature. A similar arrangement might be used with parts in carriers that had holes in them to expose the lower surfaces of the devices to thermal plate 10.

Multiple thermal plates might be used in one handler. For example, some plates might be used as a "soak" area. Parts would sit on these soak plates until they reached the desired test temperature. Then, the parts at temperature would be transferred to a plate on a plunger beneath the test site. The plate on the plunger would maintain the temperature of the parts. Then the parts might be transferred to one of another set of thermal plates in a de-soak area. The parts would stay on the plates in the de-soak area until they reached a temperature at which they would be safe to handle.

Also, it was described that vacuum is used to hold parts against the thermal plate 10. Mechanical means could be used to force parts into good thermal contact with thermal plate 10. For example, parts might be pressed between two thermal plates 10.

Therefore, the invention should be limited only by the spirit and scope of the appended claims.

What is claimed is:

1. A semiconductor handling system having a thermal plate comprising:
   a) a first member having a plurality of holes therethrough;
   b) a second member adjacent the first member having vacuum channels formed therethrough, the vacuum channels connected to the holes;
   c) an electrical resistance heater embedded in the thermal plate; and
   d) a fluid passage, having fluid inlet and a fluid outlet, formed by a channel in a surface of at least one of the first member or the second member.

2. The semiconductor handling system of claim 1 adapted to control the temperature of a plurality of semiconductor devices in a strip, wherein the plurality of holes are aligned with the semiconductor devices in the strip.

3. The semiconductor handling system of claim 1 additionally comprising a source of cooling fluid switchably coupled to the fluid inlet of the channel.

4. The semiconductor handler of claim 3 wherein the source of cooling fluid provides a cooling fluid that provides multi-phase flow in the channel.

5. The semiconductor handling system of claim 1 additionally comprising a plurality of protrusions extending into the channel.

6. The semiconductor handler of claim 1 wherein the electrical resistance heater comprises at least three separately controlled resistance heaters.

7. The semiconductor handler of claim 6 wherein the thermal plate is rectangular having a longer axis with a first end and a second end at opposing ends of the longer axis and an intermediate section between the ends, and wherein a resistance heater is disposed near each of the first end and the second end and in the intermediate section.

8. A semiconductor handling system comprising
   a) a thermal plate comprising:
      i) an upper surface having a plurality of holes therein;
      ii) an interior region having:
         A) vacuum channels formed therein, the vacuum channels connected to the holes;
         B) an electrical resistance heater embedded in the interior region; and C) a channel, having fluid inlet and a fluid outlet, embedded in the interior region;

b) a source of cooling fluid coupled to the channel through a flow control device; and c) a control system operatively connected to the electrical resistance heater and the flow control device to control the temperature of the upper surface by regulating power to the resistance heater and actuating the flow control device.

9. The semiconductor handling system of claim 8 wherein the source of cooling fluid is liquid nitrogen.

10. The semiconductor handling system of claim 8 wherein the source of cooling fluid is air.

11. The semiconductor handling system of claim 8 additionally comprising a second channel having a fluid inlet and a fluid outlet embedded in the interior region.

12. The semiconductor handling system of claim 11 additionally comprising a source of cooling fluid coupled to the channel and a second source of cooling fluid coupled to the second channel.

13. The semiconductor handling system of claim 12 wherein the source of cooling fluid provides a closed loop refrigerant.

14. The semiconductor handling system of claim 13 wherein the second source of cooling fluid provides a fluid that is a cryogenic fluid.

15. The semiconductor handling system of claim 12 additionally comprising:

a) a flow control valve coupled between the source of cooling fluid and the channel;

b) a second flow control valve coupled between the second source of cooling fluid and the second channel;

c) a controller coupled to the first flow control valve and the second flow control valve that operates to open the second flow control valve to lower the temperature of the thermal plate to a temperature required for low temperature operation.

16. The semiconductor handling system of claim 15 wherein the second source of cooling fluid provides liquid nitrogen.

17. The semiconductor handling system of claim 16 wherein the source of cooling fluid provides a closed loop refrigerant.

18. The semiconductor handling system of claim 15 wherein the source of cooling fluid provides compressed air.

19. The semiconductor handler of claim 8 additionally comprising a strip of semiconductor devices disposed on the upper surface, wherein the temperature of the semiconductor devices is controlled by increasing the heat output of the electrical resistance heater when the temperature is below a desired set point.

20. The semiconductor handler of claim 19 wherein the source of cooling fluid provides a cooling fluid that provides multi-phase flow in the channel.

21. The semiconductor handler of claim 19 wherein the source of cooling fluid provides a cooling fluid that includes liquid nitrogen.

22. A semiconductor handling system comprising a) a thermal plate comprising:
   i) an upper surface having a plurality of holes therein;
   ii) an interior region having:
      A) vacuum channels formed therein, the vacuum channels connected to the holes;
      B) an electrical resistance heater embedded in the interior region; and
      C) a channel, having fluid inlet and a fluid outlet, embedded in the interior region;

b) an electromechanical component adapted to move semiconductors within the handling system;

c) a switching unit, coupled to the electrical resistance heater and the electromechanical component, adapted to switch power to the electromechanical component to enable movement of the semiconductors within the handling system and the electrical resistance heater and to reduce power to the electrical resistance heater when power is switched to the electromechanical component; and d) a second electrical resistance heater, whereby heat is generated when the electromechanical device is receiving power, but at a lower level than when the electromechanical device is not receiving power.

23. A semiconductor handling system comprising:

a) a thermal plate comprising:
   i) an upper surface having a plurality of holes therein;
   ii) an interior region having:
      A) vacuum channels formed therein, the vacuum channels connected to the holes;
      B) an electrical resistance heater embedded in the interior region; and
      C) a channel, having fluid inlet and a fluid outlet, embedded in the interior region;

b) a source of cooling fluid coupled to the channel through a flow control device;

c) a control system operatively connected to the electrical resistance heater and the flow control device; and d) a second source of cooling fluid coupled to a channel in the plate, the second source of cooling fluid having a lower temperature than said source of cooling fluid.

24. The semiconductor handler of claim 23 wherein the temperature of the plate is decreased to a cold test temperature by increasing the flow of the second source of cooling fluid and is controlled about a test temperature by regulating the flow of said first mentioned cooling fluid.

25. The semiconductor handler of claim 23 wherein the second source of cooling fluid provides a cooling fluid that provides multi-phase flow in the channel.

26. The semiconductor handler of claim 25 wherein the second source of cooling fluid provides a fluid comprising liquid nitrogen.

\* \* \* \* \*